(12) United States Patent
Guo et al.

(10) Patent No.: US 10,840,158 B2
(45) Date of Patent: Nov. 17, 2020

(54) PIXEL STRUCTURE

(71) Applicant: AU Optronics Corporation, Hsin-Chu (TW)

(72) Inventors: Ting-Wei Guo, Hsin-Chu (TW); Cheng-Chieh Chang, Hsin-Chu (TW); Chen-Chi Lin, Hsin-Chu (TW); Yi-Cheng Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/207,351

(22) Filed: Dec. 3, 2018

(65) Prior Publication Data
US 2019/0172761 A1     Jun. 6, 2019

(30) Foreign Application Priority Data
Dec. 4, 2017 (TW) .............................. 106142451 A

(51) Int. Cl.
| | |
|---|---|
| *H01L 25/075* | (2006.01) |
| *H01L 21/66* | (2006.01) |
| *H01L 33/62* | (2010.01) |
| *H01L 27/12* | (2006.01) |
| *H01L 33/44* | (2010.01) |
| *H01L 25/16* | (2006.01) |

(52) U.S. Cl.
CPC .......... *H01L 22/22* (2013.01); *H01L 25/0753* (2013.01); *H01L 25/0756* (2013.01); *H01L 25/167* (2013.01); *H01L 27/1214* (2013.01); *H01L 33/44* (2013.01); *H01L 33/62* (2013.01)

(58) Field of Classification Search
CPC ................................................... H01L 25/0756
USPC .......................................................... 257/99
See application file for complete search history.

(56) References Cited

U.S. PATENT DOCUMENTS

| | | | |
|---|---|---|---|
| 8,680,693 B2 | 3/2014 | Kang et al. | |
| 10,312,165 B1* | 6/2019 | Hsiang | ................ H01L 25/0753 |
| 2015/0369453 A1 | 12/2015 | Eritt et al. | |

* cited by examiner

*Primary Examiner* — Hsin Yi Hsieh
(74) *Attorney, Agent, or Firm* — WPAT, PC

(57) ABSTRACT

A pixel structure includes at least one sub-pixel. The sub-pixel includes a substrate, a first micro light-emitting element, a repair micro light-emitting element, a first connecting line, a second connecting line, and a bridge pattern. The first micro light-emitting element is disposed on the substrate. The repair micro light-emitting element is disposed on the first micro light-emitting element and partially overlaps the first micro light-emitting element in a vertical direction of the substrate. The first connecting line is electrically connected to a first electrode of the first micro light-emitting element and a third semiconductor layer of the repair micro light-emitting element. The second connecting line is electrically connected to a second electrode of the first micro light-emitting element. The bridge pattern is located between the first micro light-emitting element and the repair micro light-emitting element, and is electrically connected to the second electrode and a fourth semiconductor layer of the repair micro light-emitting element.

19 Claims, 13 Drawing Sheets

PIXEL STRUCTURE

BACKGROUND

Technical Field

The present disclosure relates to a sub-pixel repair technology, and in particular, to a pixel structure.

Related Art

Light-emitting elements are widely applied to display panels for their advantages such as high photoelectric conversion efficiency and long life-time. Usually, a light-emitting element is disposed in a sub-pixel. However, when being damaged or falling off, the light-emitting element cannot emit light. Consequently, dark spots are generated on the display panel. Further, it is difficult to reprocess the display panel and the process is cumbersome. This is the direction that the industry still endeavors to improve at present.

SUMMARY

An embodiment of the present disclosure provides a pixel structure, including a substrate, at least one driving element, a first micro light-emitting element, a repair micro light-emitting element, a first connecting line, a second connecting line, an insulation layer, and a bridge pattern. A driving element is disposed on the substrate. The first micro light-emitting element is disposed on the substrate and is electrically connected to the driving element. The first micro light-emitting element includes a first semiconductor layer, a second semiconductor layer, a first electrode, and a second electrode. A doping type of the first semiconductor layer is different from a doping type of the second semiconductor layer. The first electrode is electrically connected to the first semiconductor layer, and the second electrode is electrically connected to the second semiconductor layer. The repair micro light-emitting element is disposed on the first micro light-emitting element and partially overlaps the first micro light-emitting element in a vertical direction of the substrate. The repair micro light-emitting element includes a third semiconductor layer and a fourth semiconductor layer, and a doping type of the third semiconductor layer is different from a doping type of the fourth semiconductor layer. The first connecting line is electrically connected to the first electrode of the first micro light-emitting element, the third semiconductor layer of the repair micro light-emitting element, and the driving element. The second connecting line is electrically connected to the second electrode of the first micro light-emitting element. The insulation layer is disposed on the first micro light-emitting element and partially covers the first micro light-emitting element. The insulation layer has a first opening and a second opening, the first opening partially overlaps the first connecting line, and the second opening partially overlaps the second connecting line. The bridge pattern is located between the first micro light-emitting element and the repair micro light-emitting element, and is electrically connected to the second electrode and the fourth semiconductor layer of the repair micro light-emitting element.

DETAILED DESCRIPTION

Figure 1:
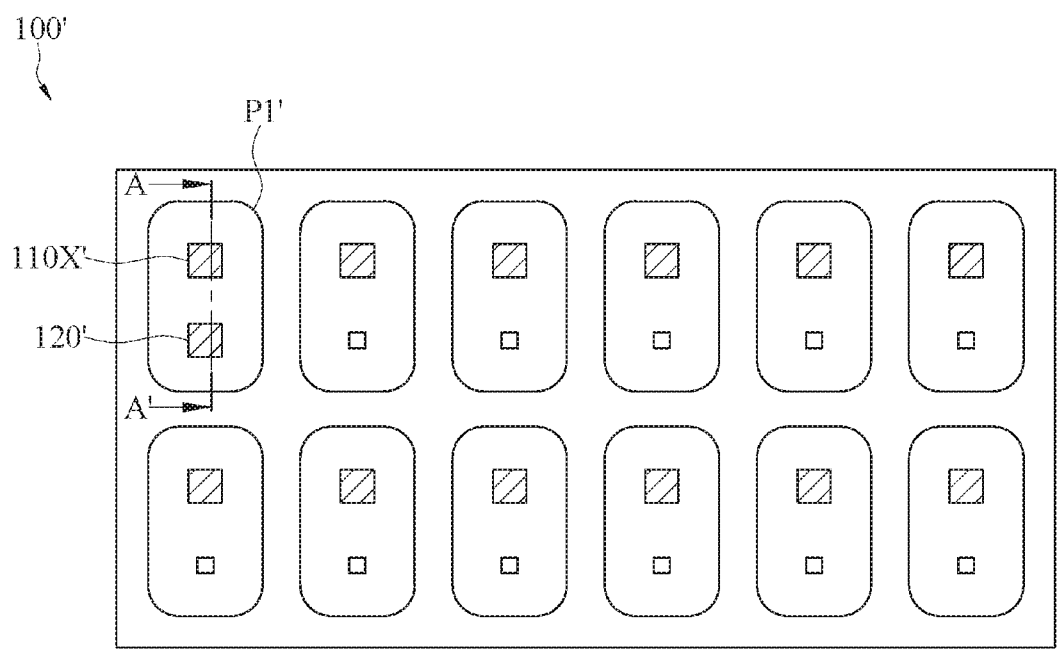
FIG. 1 is a top view of a pixel structure according to a comparative example.

In the accompanying drawings, for clarity, thicknesses of a layer, a film, a panel, an area, and the like are enlarged. In the entire specification, same reference numeral indicate same elements. It should be understood that when an element such as a layer, a film, an area, or a substrate is referred to as being "on" another element or being "connected" to another element, the element may be directly on the another element or connected to the another element, or an intermediate element may exist. On the contrary, when an element is referred to as being "directly on another element" or "directly connected to" another element, no intermediate element exists. As used in this specification, "connection" may be physical and/or electrical connection. Further, electrical connection or coupling may mean that another element exists between two elements.

"About", "approximately", "substantially", or "roughly" used in this specification includes an average value of the value and a particular value determined by a person of ordinary skill in the art in an acceptable deviation range, and a discussed measurement and a particular quantity of errors related to the measurement (that is, a limitation of a measurement system) are considered. For example, "about" may indicate to be in one or more standard deviations of the value, or in ±30%, ±20%, ±10%, or ±5%. Further, for "about", "approximately", or "substantially" used in this specification, a relatively acceptable deviation range or standard deviation may be selected according to the optical property, the etching property, or another property, and one standard deviation may not be used for all properties.

Unless otherwise defined, all terms (including technical and scientific terms) used in this specification have the same meaning as that understood by a person of ordinary skill in the art. It should be further understood that terms defined in a usually used dictionary should be explained to have a consistent meaning with that in the related art and the context of this specification, and not be explained to have an ideal or excessively formal meaning, unless clearly defined in this specification.

Figure 2:
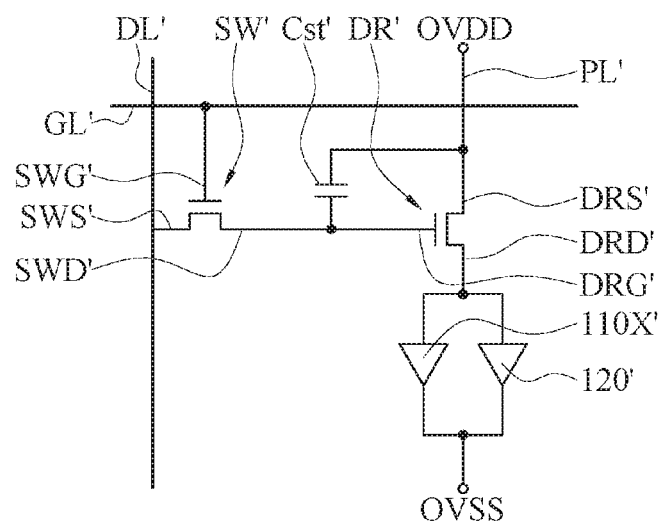
FIG. 2 is an equivalent circuit diagram of a sub-pixel of the pixel structure corresponding to FIG. 1.
Figure 3:
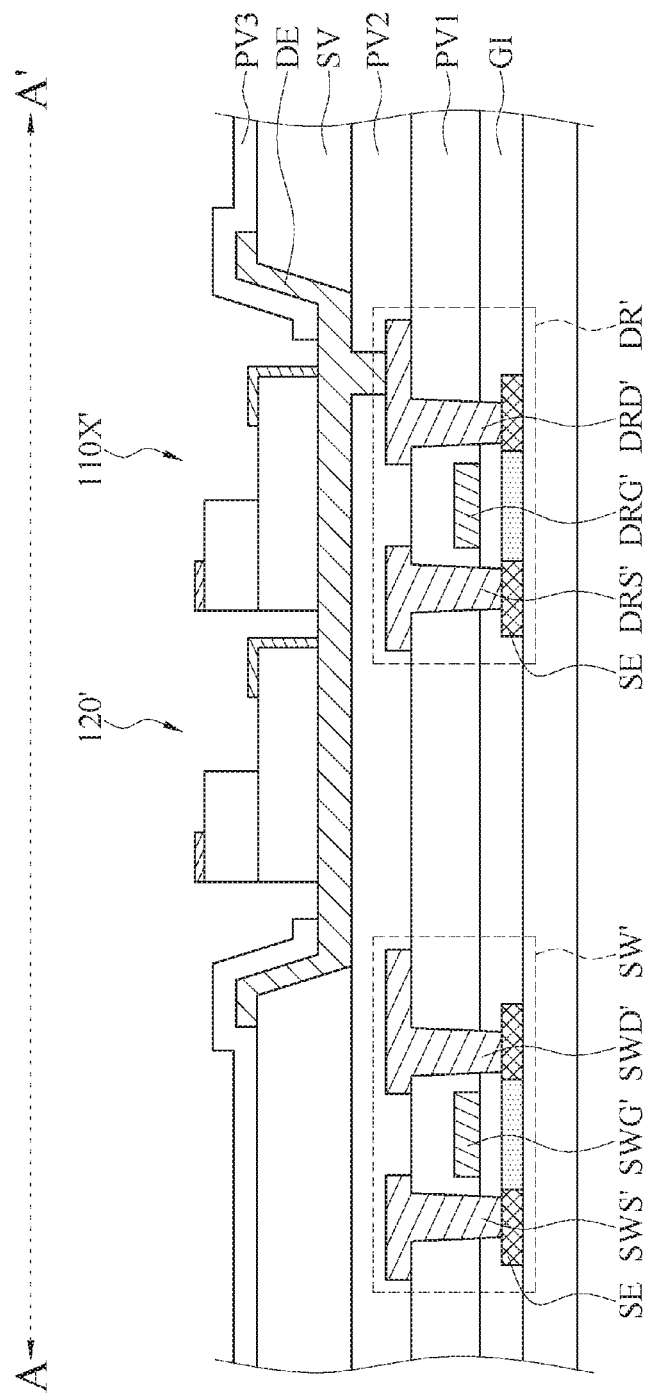
FIG. 3 is a schematic cross-sectional view of a sub-pixel according to a comparative example along section line A-A' corresponding to FIG. 1.

FIG. 1 is a top view of a pixel structure according to a comparative example. FIG. 2 is an equivalent circuit diagram of a sub-pixel of the pixel structure corresponding to FIG. 1. FIG. 3 is a schematic cross-sectional view of a sub-pixel according to a comparative example along section line A-A' corresponding to FIG. 1. Referring to FIG. 1, FIG. 2, and FIG. 3, a driving architecture of a sub-pixel P1' of a pixel structure 100' in the comparative example is roughly the same as a driving architecture in embodiments of the present disclosure (for example, a 2T1C driving architecture is used). The driving architecture of the pixel structure in the comparative example includes a switching element SW', a driving element DR', and a storage capacitor Cst', but the present disclosure is not limited thereto. For a detailed design of an electrical connection between various elements, refer to subsequent descriptions corresponding to FIG. 4. When a first micro light-emitting element 110X' in the comparative example shown in FIG. 1 is damaged or broken, because a disposing position of a repair micro light-emitting element 120' is different from a position of the first micro light-emitting element 110X', the repair micro light-emitting element 120' is usually disposed at reserved space beside the first micro light-emitting element 110X', and is connected in parallel to the first micro light-emitting element 110X'. To avoid a short circuit caused by inappropriate contact between lines or electrodes in the sub-pixel P', usually, the first micro light-emitting element 110X', or a line between the first micro light-emitting element 110X' and the driving element DR' is removed, or insulation layers are disposed on an anode and a cathode of the first micro light-emitting element 110X', so that the repair micro light-emitting element 120' is electrically insulated from the first micro light-emitting element 110X'. Therefore, a light field type of light emitted by the repair micro light-emitting element 120' may be affected. In addition, the repair micro light-emitting element 120', and a spare connecting pad and a spare line thereof occupy the display area of the sub-pixel, leading to a decrease in an aperture ratio. In addition, additional steps for reprocessing or a repair process are required, and manufacturing of additional spare connecting pads and spare lines makes the process cumbersome and a line design complex.

Referring to FIG. 3, the switching element SW' and the driving element DR' in FIG. 3 use a top-gate thin film transistor (top-gate TFT) as an example. That is, gate electrodes SWG' and DRG' are located on a semiconductor layer SE. In other embodiments, the switching element SW' and the driving element DR' may alternatively be bottom-gate thin film transistors (bottom-gate TFT). That is, gate electrodes SWG' and DRG' are located below a semiconductor layer SE. Using the top-gate TFT as an example, a gate dielectric layer GI covers the semiconductor layer SE, a first insulation layer PV1 covers the gate electrodes SWG' and DRG', source electrodes SWS' and DRS' and drain electrodes SWD' and DRD' respectively passes through the first insulation layer PV1 to be electrically connected to the corresponding semiconductor layer SE. A second insulation layer PV2 covers the switching element SW' and the driving element DR'. A pixel definition layer SV may optionally be disposed on the second insulation layer PV2, and a third insulation layer PV3 may optionally be disposed on the pixel definition layer SV. A conductive electrode DE is disposed on the second insulation layer PV2. The conductive electrode DE may optionally have a reflective conductive layer, but the present disclosure is not limited thereto. The first micro light-emitting element 110X' and the repair micro light-emitting element 120' may optionally be disposed on the conductive electrode DE by using solder (not shown) or an adhesive layer (not shown).

Figure 4:
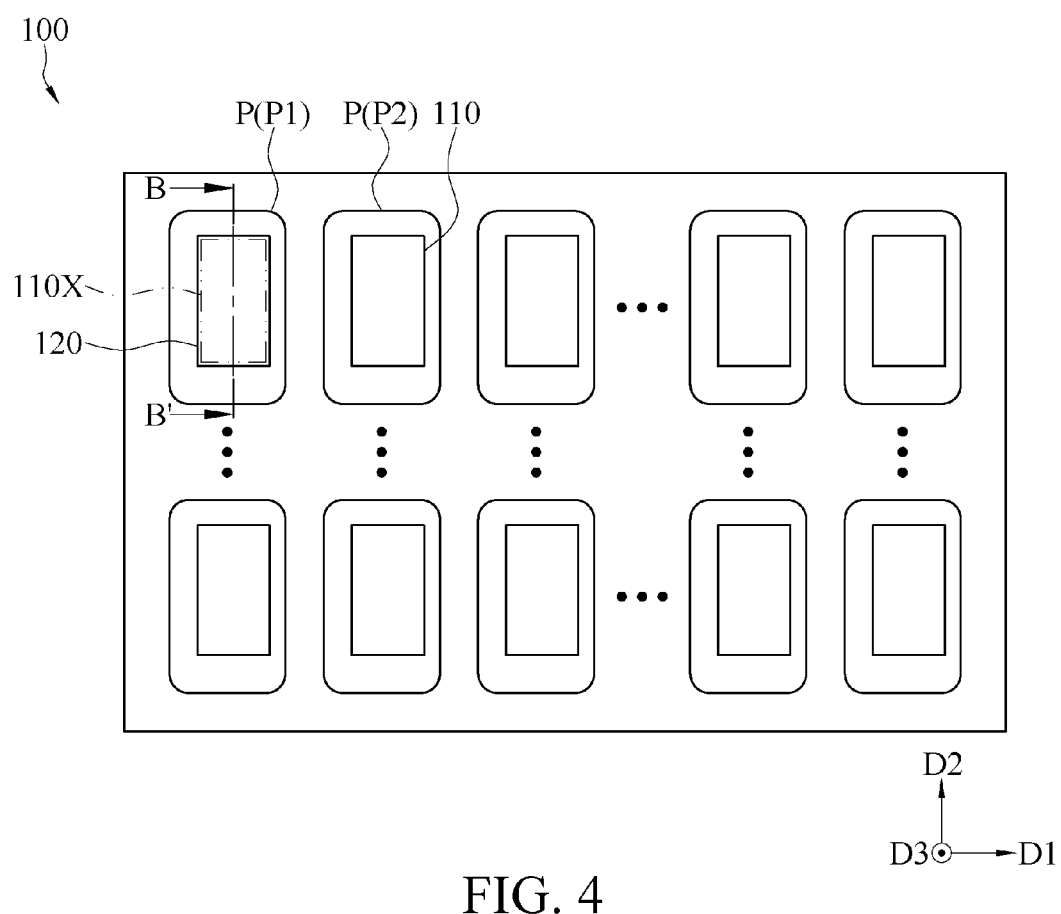
FIG. 4 is a top view of a pixel structure according to a first embodiment of the present disclosure.

FIG. 4 is a top view of a pixel structure according to a first embodiment of the present disclosure. Referring to FIG. 4, in this embodiment, the pixel structure 100 includes a plurality of sub-pixels P. The plurality of sub-pixels P is arranged in a matrix in a first direction D1 and a second direction D2. A structure of the plurality of sub-pixels can enable a display panel to achieve a full-color display effect. For example, the pixel structure 100 has a first sub-pixel P1 and a second sub-pixel P2 which respectively have a light-emitting element (for example, a first micro light-emitting element 110X). If a detection result shows that a function of the first micro light-emitting element 110X of the first sub-pixel P1 is abnormal (for example, being abnormal in this specification may be luminance degradation or nonluminous, but the present disclosure is not limited thereto), the first micro light-emitting element 110X that has an abnormal function may be reprocessed or repaired. That is, another light-emitting element (for example, a repair micro light-emitting element 120) is disposed in the first sub-pixel P1. Therefore, the first micro light-emitting element 110X is as a repaired micro light-emitting element or a predetermined repair micro light-emitting element. It should be noted that, FIG. 4 is a simple schematic diagram, and does not shown electrodes of the first micro light-emitting element 110X, a second micro light-emitting element 190, and the repair micro light-emitting element 120, or lines used for electrical connection (for example, first to fourth electrodes 113, 114, 123, 124, 193, 194, a first connecting line 130, a second connecting line 140, or other lines for subsequent description).

Figure 5:
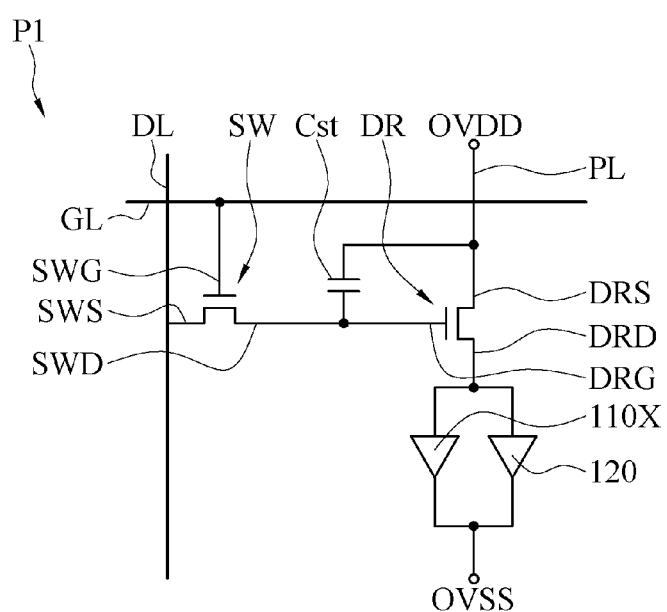
FIG. 5 is an equivalent circuit diagram of a sub-pixel of the pixel structure corresponding to FIG. 4.

Referring to FIG. 5, FIG. 5 is an equivalent circuit diagram of a sub-pixel of the pixel structure corresponding to FIG. 4. The driving architecture of the sub-pixel in FIG. 2 and a driving architecture of the sub-pixel in FIG. 5 use a 2T1C driving architecture as an example. For example, the driving architecture includes two thin film transistors (including a switching element SW and a driving element DR) and a storage capacitor Cst, but the present disclosure is not limited thereto. In other implementation aspects, the driving architecture of the pixel structure may further adjust the numbers of and structures of thin film transistors and storage capacitors according to a circuit design or process. The driving architecture is, but is not limited to, for example, a 3T1C architecture, a 3T2C architecture, a 4T1C architecture, a 4T2C architecture, a 5T1C architecture, a 5T2C architecture, a 6T1C architecture, a 6T2C architecture, or another appropriate driving architecture. For example, a gate electrode SWG of the switching element SW is electrically connected to a gate line GL, a source electrode SWS is electrically connected to a data line DL, a drain electrode SWD of the switching element SW is electrically connected to a gate electrode DRG of the driving element DR and one end of the storage capacitor Cst, and one end of the storage capacitor Cst is electrically connected between the drain electrode SWD of the switching element SW and the gate electrode DRG of the driving element DR. The other end of the storage capacitor Cst is electrically connected to a power line PL and a source electrode DRS of the driving element DR. A drain electrode DRD of the driving element DR is electrically connected to the first micro light-emitting element 110X. In addition, the power line PL can provide a voltage OVDD for one electrode (such as an anode) of the first micro light-emitting element, and the other electrode (such as a cathode) of the first micro light-emitting element can receive a voltage OVSS. The voltage OVSS may be a common voltage, a ground voltage, or another appropriate voltage. The light-emitting element of each sub-pixel P can receive substantially same voltages OVSS, but the present disclosure is not limited thereto.

Figure 6:
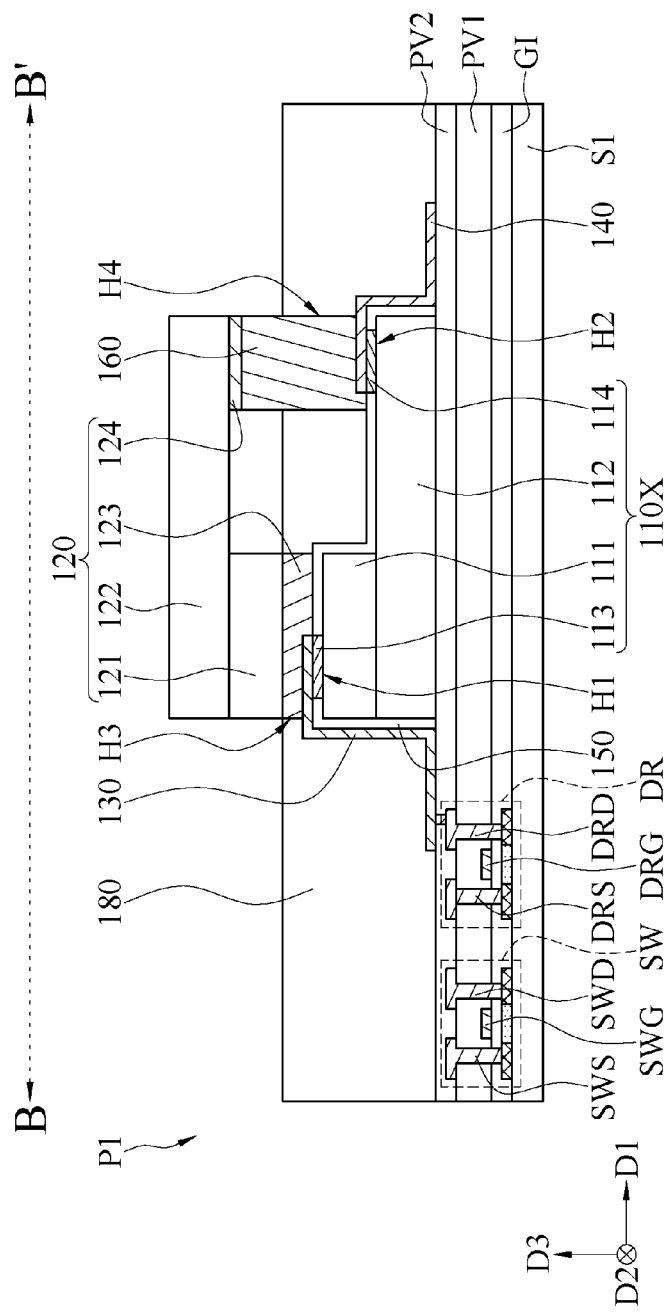
FIG. 6 is a schematic cross-sectional view of a sub-pixel according to an example embodiment along section line B-B' corresponding to FIG. 4.

FIG. 6 is a schematic cross-sectional view of a sub-pixel according to an example embodiment along section line B-B' corresponding to FIG. 4. Referring to FIG. 4, FIG. 5, and FIG. 6 together, herein, the pixel structure 100 includes at least one sub-pixel P1. The sub-pixel P1 includes a substrate S, at least one driving element DR, the first micro light-emitting element 110X, the repair micro light-emitting element 120, the first connecting line 130, the second connecting line 140, an insulation layer 150, and a bridge pattern 160. The first micro light-emitting element 110X is a repaired micro light-emitting element or a predetermined repair micro light-emitting element, is disposed on the substrate S1, and is electrically connected to the driving element DR. The pixel structure 100 may further include a sub-pixel P2. A micro light-emitting element 110 of the sub-pixel P2 can emit light normally, and therefore, a repair micro light-emitting element 120 does not need to be disposed. The repair micro light-emitting element 120 is a micro light-emitting element disposed during reprocessing or a repair process, and is disposed on the first micro light-emitting element 110X. The first micro light-emitting element 110X partially overlaps the repair micro light-emitting element 120 in a vertical projection direction D3.

The size of the first micro light-emitting element 110X and that of the repair micro light-emitting element 120 are in micron scale or smaller than the micron scale. The first micro light-emitting element 110 and the repair micro light-emitting element 120 may be micro light-emitting diodes (s-LED) which are of a size less than 10 microns, but the present disclosure is not limited to this value. In addition, the first micro light-emitting element 110X may optionally be disposed on the substrate S1 by using solder (not shown) or an adhesive layer (not shown).

The first micro light-emitting element 110X includes a first semiconductor layer 111, a second semiconductor layer 112, the first electrode 113, and the second electrode 114. The first semiconductor layer 111 is electrically connected to the second semiconductor layer 112, the first electrode 113 is electrically connected to the first semiconductor layer 111, and the second electrode 114 is electrically connected to the second semiconductor layer 112. In some implementations, the first micro light-emitting element 110X is preferably of a horizontal diode structure. For example, the first electrode 113 and the second electrode 114 are respectively located on a same side of the first semiconductor layer 111 and the second semiconductor layer 112, but the present disclosure is not limited thereto.

In the vertical projection direction D3 toward the substrate S, a vertical projection range of the repair micro light-emitting element 120 at least partially overlaps a vertical projection range of the first micro light-emitting element 110X. The repair micro light-emitting element 120 includes a third semiconductor layer 121, a fourth semiconductor layer 122, a third electrode 123, and a fourth electrode 124. The third semiconductor layer 121 is electrically connected to the fourth semiconductor layer 122, the third electrode 123 is electrically connected to the third semiconductor layer 121, and the fourth electrode 124 is electrically connected to the fourth semiconductor layer 122.

In some implementations, the repair micro light-emitting element 120 may be of a horizontal diode structure. For example, the third electrode 123 and the fourth electrode 124 are respectively located on a same side of the third semiconductor layer 121 and the fourth semiconductor layer 122, but the present disclosure is not limited thereto. The third semiconductor layer 121 can extend toward the first micro light-emitting element 110X in the vertical projection direction D3, and is located between the first semiconductor layer 111 and the fourth semiconductor layer 122. A vertical projection range of the first semiconductor layer 111 may roughly overlap a vertical projection range of the third semiconductor layer 121, and a vertical projection range of the second semiconductor layer 112 roughly overlaps a vertical projection range of the fourth semiconductor layer 122.

The insulation layer 150 may be disposed on the first micro light-emitting element 110X and partially covers the first micro light-emitting element 110X. The insulation layer 150 has a first opening H1 and a second opening H2. The first opening H1 exposes part of the first semiconductor layer 111 of the first micro light-emitting element 110X, and the second opening H2 exposes part of the second semiconductor layer 112 of the first micro light-emitting element 110X. The first electrode 113 is disposed on the first semiconductor layer 111, and at least part of the first electrode 113 is located in the first opening H1. The second electrode 114 is disposed on the second semiconductor layer 112, and at least part of the second electrode 114 is located in the second opening H2. The first connecting line 130 and the second connecting line 140 may be disposed on the insulation layer 150. The first connecting line 130 partially overlaps the first opening H1, and is electrically connected to the first electrode 113 and the third electrode 123. The second connecting line 140 partially overlaps the second opening H2, and is electrically connected to the second electrode 114 and the bridge pattern 160. In a process procedure in some implementations, a conductive material layer (not shown) is formed on the insulation layer 150. Subsequently, the conductive material layer is etched by means of laser or another process to form the first connecting line 130 and the second connecting line 140. In some implementations, the process procedure of forming the first connecting line 130 and the second connecting line 140 may alternatively be a printing conductive material process, an exposure and development conductive material process, or another appropriate process. In this case, a position where the first micro light-emitting element 110X is located between the first connecting line 130 and the second connecting line 140 may optionally have a slightly rough surface, but the present disclosure is not limited thereto.

In another embodiment, the pixel structure 100 may further include a protection layer 180 covering the first micro light-emitting element 110X. The protection layer 180 has a third opening H3 and a fourth opening H4. A vertical projection range of the third opening H3 at least partially overlaps the vertical projection range of the third semiconductor layer 121, and a vertical projection range of the fourth opening H4 at least partially overlaps a vertical projection range of the bridge pattern 160.

The first micro light-emitting element 110X and the repair micro light-emitting element 120 may share the first connecting line 130 and the second connecting line 140 to be electrically connected to other circuits (not shown). In this example embodiment, the first micro light-emitting element 110X and the repair micro light-emitting element 120 share the first connecting line 130 and the second connecting line 140 to be electrically connected to the driving element DR and a power line PL, respectively. The insulation layer 150 is disposed between the rust connecting line 130 and the first micro light-emitting element 110X and between the second connecting line 140 and the first micro light-emitting element 110X. The bridge pattern 160 is located between the first micro light-emitting element 110X and the repair micro light-emitting element 120.

In some implementations, the substrate S1 may be a rigid substrate, for example but not limited to a glass substrate or a sapphire substrate. In some other implementations, the substrate S1 may alternatively be a soft substrate, for example but not limited to a flexible substrate. In an implementation, for example, the switching element SW and/or the driving element DR is a thin film transistor (TFT), for example but not limited to a top-gate TFT, a bottom-gate TFT, or another appropriate type of TFT, so as to form an active array substrate.

In an implementation, at least one of the first electrode 113, the second electrode 114, the third electrode 123, and the fourth electrode 124 may be of a monolayer or multilayer structure, and a material thereof may be metal, an alloy, a transparent conductive material, another appropriate material, or a combination (for example, mixing and blending) of at least two of the foregoing materials.

In some implementations, a doping type of the first semiconductor layer 111 is different from a doping type of the second semiconductor layer 112, and a doping type of the third semiconductor layer 121 is different from a doping type of the fourth semiconductor layer 122. In some implementations, when the first semiconductor layer 111 and the third semiconductor layer 121 may be one of P-type semiconductor layers or N-type semiconductor layers, and the second semiconductor layer 112 and the fourth semiconductor layer 122 may be another of P-type semiconductor layers or N-type semiconductor layers. That is, the doping type of the first semiconductor layer 111 may be substantially the same as the doping type of the third semiconductor layer 121, and the doping type of the second semiconductor layer 112 may be substantially the same as the doping type of the fourth semiconductor layer 122, but the present disclosure is not limited thereto. Herein, a type of a light-emitting layer of the first micro light-emitting element 110 may be a P-N junction. However, in another implementation aspect, the first micro light-emitting element 110 may further include an intrinsic semiconductor layer, or referred to as a quantum well (QW, not shown) which may include a multiple QW (MQW) or a single QW (SQW). Herein, the type of the light-emitting layer of the first micro light-emitting element 110 may be a P-I-N junction. In some implementations, the first semiconductor layer 111 and the second semiconductor layer 112 may respectively use materials from the second group and the sixth group in the periodic table. For example, cadmium selenide (CdSe), cadmium sulphide (CdS), or zinc selenide (ZnSe) is formed. Alternatively, the first semiconductor layer 111 and the second semiconductor layer 112 may respectively use materials from the third group and the fifth group in the periodic table. For example, gallium arsenide (GaAs), indium phosphide (InP), gallium nitride (GaN), aluminum nitride (AlN), aluminium nitride (InN), indium-gallium-nitride (InGaN), or another appropriate material is formed. However, the present disclosure is not limited thereto.

However, in other implementations, as shown in FIG. 6, the third electrode 123 of the repair micro light-emitting element 120 may be integrally formed with the first electrode 113 of the first micro light-emitting element 110X and/or the first connecting line 130, but the present disclosure is not limited thereto.

The first connecting line 130 is electrically connected to the first electrode 113 of the first micro light-emitting element 110X, the third semiconductor layer 121 of the repair micro light-emitting element 120, and the driving element DR. The second connecting line 140 is electrically connected to the second electrode 114 of the first micro light-emitting element 110X, the fourth semiconductor layer 122 of the repair micro light-emitting element 120, and the power line PL. Herein, the first connecting line 130 may be at least disposed between the first electrode 113 and the third electrode 123, and the second connecting line 140 is at least disposed between the second electrode 114 and the fourth electrode 124.

In some implementations, at least one of the first connecting line 130 and the second connecting line 140 may be of a monolayer or multilayer structure, and a material thereof may be metal, an alloy, a transparent conductive material, or another appropriate material.

The bridge pattern 160 is located between the first micro light-emitting element 110X and the repair micro light-emitting element 120. In an embodiment, the bridge pattern 160 is located between the second electrode 114 of the first micro light-emitting element 110X and the fourth electrode 124 of the repair micro light-emitting element 120, and is electrically connected to the second electrode 114 of the first micro light-emitting element 110X, the fourth semiconductor layer 122 of the repair micro light-emitting element 120, and the second connecting line 140. In this embodiment, in the vertical projection direction D3 toward the substrate S1, the vertical projection range of the bridge pattern 160 is in a projection range of the second semiconductor layer 112. For example, the bridge pattern 160 is stacked on the second semiconductor layer 112 of the first micro light-emitting element 110X, and overlaps the second semiconductor layer 112 in a vertical direction of the substrate S1. First, the bridge pattern 160 may be formed on the second connecting line 140 which is on the first micro light-emitting element 110X, and then the repair micro light-emitting element 120 is transposed (or namely transferred and disposed) on the bridge pattern 160 and the first connecting line 130. Alternatively, first, the bridge pattern 160 is formed on the fourth electrode 124 of the repair micro light-emitting element 120, and then the repair micro light-emitting element 120 is transposed (or namely transferred and disposed) on the first micro light-emitting element 110X.

In addition, the bridge pattern 160 may have multiple forms according to structures of the first micro light-emitting element 110X and the repair micro light-emitting element 120 or a stack design. In an embodiment, the bridge pattern 160 is a conductive electrode. One end of the bridge pattern 160 is electrically connected to the fourth semiconductor layer 122, and the other end of the bridge pattern 160 is connected to the second connecting line 140. The bridge pattern 160 (such as the conductive electrode) may be integrally formed with the fourth electrode 124 based on a design. In another implementation, the bridge pattern 160 is integrally formed with the fourth electrode 124. The height of the first electrode 113 and the height of the second electrode 114 are different in the vertical projection direction D3. In an exemplary embodiment, the height of the second electrode 114 is greater than the height of the first electrode 113 in the vertical projection direction D3. In this case, the height of the bridge pattern 160 in the vertical projection direction D3 may be reduced. Further, to make the repair micro light-emitting element 120 be steadily located on the first micro light-emitting element 110X, the thickness of the bridge pattern 160 may be changed according to a design requirement. For example, when the thickness of the bridge pattern 160 is greater than the thickness of the protection layer 180, a top surface of the bridge pattern 160 may be higher than a top surface of the protection layer 180 to be electrically connected to the fourth semiconductor layer 122 and the second semiconductor layer 112; when the thickness of the bridge pattern 160 is substantially equal to or less than the thickness of the protection layer 180, the bridge pattern 160 may be electrically connected to the fourth semiconductor layer 122 and the second semiconductor layer 112 by increasing the thickness of the electrode. To increase the thickness of the electrode, the thickness of at least one of the fourth electrode 124, a second connecting line 140, the second electrode 114, an additional electrode (not shown), or another appropriate electrode may optionally be increased.

In an implementation, the bridge pattern 160 may be of a monolayer or multilayer structure, and a material thereof may be metal, an alloy, a transparent conductive material, or another appropriate material.

In this embodiment, the doping type of the first semiconductor layer 111 may be substantially the same as the doping type of the third semiconductor layer 121, and the doping type of the second semiconductor layer 112 may be substantially the same as the doping type of the fourth semiconductor layer 122. The third semiconductor layer 121 of the repair micro light-emitting element 120 is electrically connected to the first semiconductor layer 111 of the first micro light-emitting element 110X through the first electrode 113, and the fourth semiconductor layer 122 of the repair micro light-emitting element 120 is electrically connected to the second semiconductor layer 112 of the first micro light-emitting element 110X through the bridge pattern 160 and the second electrode 114. Herein, the repair micro light-emitting element 120 may be viewed as being coupled in parallel to the first micro light-emitting element 110X.

When a detection result shows that a function of the first micro light-emitting element 110X is abnormal, a repair micro light-emitting element 120 is disposed on the first micro light-emitting element 110X for reprocessing or repair. For example, the first semiconductor layer 111 and the third semiconductor layer 121 are both P-type semiconductor layers, and the first electrode 113 and/or the third electrode 123 may serve as an anode. The second semiconductor layer 112 and the fourth semiconductor layer 122 are both N-type semiconductor layers, and the second electrode 114 and the fourth electrode 124 or the bridge pattern 160 may serve as cathodes. However, the present disclosure is not limited thereto. The power line PL provides a voltage OVDD which is transmitted to the first micro light-emitting element 110X and the repair micro light-emitting element 120 through the first connecting line 130. The first micro light-emitting element 110X and the repair micro light-emitting element 120 can receive a voltage OVSS through the second connecting line 140. The voltage OVSS may be a common voltage, a ground voltage, or another appropriate voltage. Therefore, the first micro light-emitting element 110X may be repaired by transposing the repair micro light-emitting element 120 on the first micro light-emitting element 110X, and an additional electrode/circuit layer does not need to be disposed after the first micro light-emitting element 110X is adhered to or electrically connected to the repair micro light-emitting element 120.

In addition, the third semiconductor layer 121 of the repair micro light-emitting element 120 extends toward the first micro light-emitting element 110X, and corresponds to a position on the first semiconductor layer 111 of the first micro light-emitting element 110X. For the first micro light-emitting element 110X and the repair micro light-emitting element 120, some semiconductor layers may be removed by etching and/or another process to adjust sectional shapes of the first micro light-emitting element 110X and the repair micro light-emitting element 120. In this example embodiment, part of the first semiconductor layer 111 and part of the third semiconductor layer 121 are removed. For example, the cross-sectional shape is an L shape or an L-like shape (for example, the cross-sectional shape of the first micro light-emitting element 110X or the cross-sectional shape of the repair micro light-emitting element 120 in FIG. 6), a U shape or a U-like shape (for example, a cross-sectional shape of a repair micro light-emitting element 120 in FIG. 8), or another appropriate sectional shape. In this case, the first micro light-emitting element 110X and the repair micro light-emitting element 120 may have multiple stacking forms.

Referring to FIG. 6, in this embodiment, the first micro light-emitting element 110X and the repair micro light-emitting element 120 are both L-like shaped. Using the first micro light-emitting element 110X and a horizontal structure as an example, one side of the first semiconductor layer 111 is etched and removed, so that the first semiconductor layer 111 is located on the second semiconductor layer 112, and the width of the first semiconductor layer 111 in a first direction D1 is less than the width of the second semiconductor layer 112 in the first direction D1. For example, the vertical projection range of the first semiconductor layer 111 is smaller than the vertical projection range of the second semiconductor layer 112, and approximately corresponds to one side of the vertical projection range of the second semiconductor layer 112. Using the repair micro light-emitting element 120 and a horizontal structure as an example, part of the third semiconductor layer 121 is etched and removed, so that the third semiconductor layer 121 is located on the fourth semiconductor layer 122, and the width of the third semiconductor layer 121 in the first direction D1 is less than the width of the fourth semiconductor layer 122 in the first direction D1. For example, the vertical projection range of the third semiconductor layer 121 is smaller than the vertical projection range of the fourth semiconductor layer 122, and approximately corresponds to one side of the vertical projection range of the fourth semiconductor layer 122. In this embodiment, as shown in FIG. 6, the third semiconductor layer 121 is vertically stacked on the first semiconductor layer 111, and the distance between the fourth semiconductor layer 122 and the second semiconductor layer 112 is roughly equivalent to the superposed thickness of the first semiconductor layer 111, the third semiconductor layer 121, the first connecting line 130, and/or the third electrode 123. It can be learned from another aspect that the vertical projection range of the third semiconductor layer 121 can at least partially overlap the vertical projection range of the first semiconductor layer 111, and the vertical projection range of the fourth semiconductor layer 122 can at least partially overlap the vertical projection range of the second semiconductor layer 112. In an implementation, as shown in FIG. 6, the width of the fourth semiconductor layer 122 in the first direction D1 is roughly equal to the width of the second semiconductor layer 112 in the first direction D1. It can be learned from another aspect that the vertical projection range of the fourth semiconductor layer 122 is roughly equal to the vertical projection range of the second semiconductor layer 112. In some embodiments, the first micro light-emitting element 110X and the repair micro light-emitting element 120 have a roughly same size, so that the process may be more convenient, and no additional process is required for a difference between the sizes of the first micro light-emitting element 110X and the repair micro light-emitting element 120.

It should be noted herein that, element numbers and part of content of the embodiment of FIG. 6 are still used in embodiments of FIG. 7, FIG. 8, FIG. 9, and FIG. 10, same or similar reference numerals are used to represent same or similar elements, and descriptions of the same technical content are omitted. For the omitted descriptions, refer to the embodiments described above, and no further details are provided herein.

Figure 7:
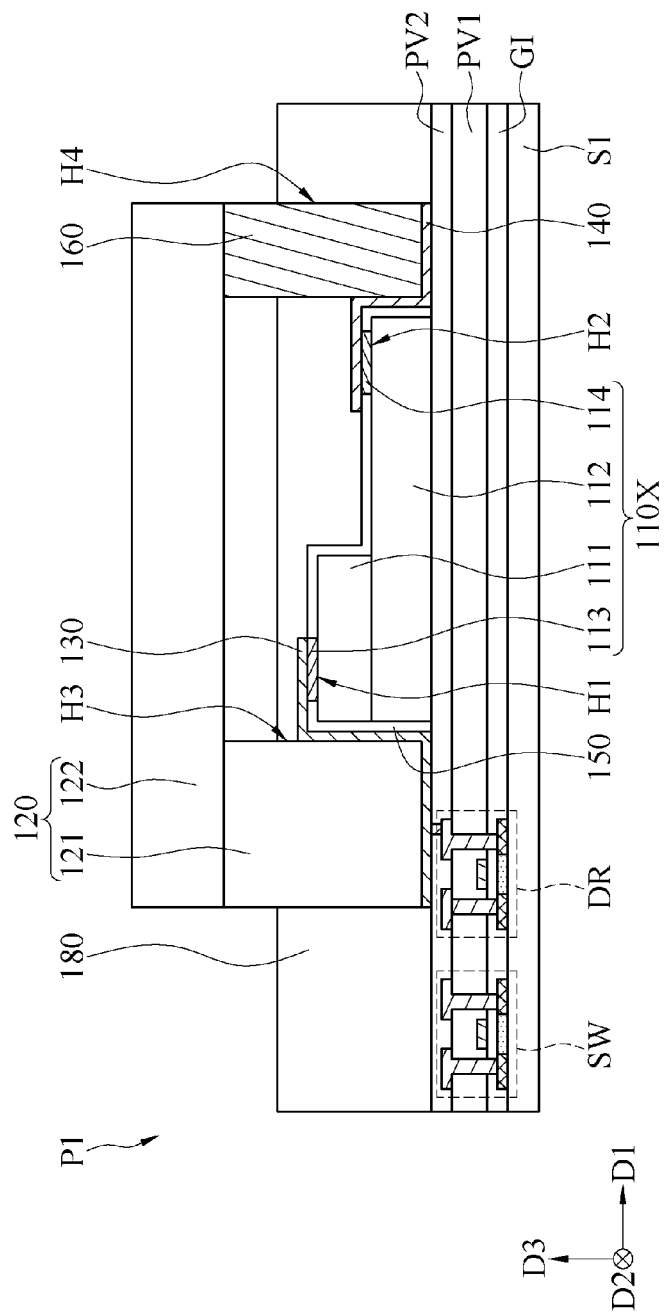
FIG. 7 is a schematic cross-sectional view of a sub-pixel according to another example embodiment along section line B-B' corresponding to FIG. 4.

Referring to FIG. 7, FIG. 7 is a schematic cross-sectional view of a sub-pixel according to another example embodiment along section line B-B' corresponding to FIG. 4. In the another example embodiment, both the first micro light-emitting element 110X and the repair micro light-emitting element 120 are L-shaped or L-like shaped. A difference between FIG. 6 and FIG. 7 lies in that the width of the fourth semiconductor layer 122 in the first direction D1 is greater than the width of the second semiconductor layer 112 in the first direction D1. It can be learned from another aspect that the vertical projection range of the third semiconductor layer 121 does not overlap the vertical projection range of the first semiconductor layer 111, and the vertical projection range of the fourth semiconductor layer 122 partially overlaps the vertical projection range of the second semiconductor layer 112. The bridge pattern 160 is located on the substrate S1, and is located on a side (for example, the other outer side) of the first micro light-emitting element 110X relative to the third semiconductor layer 121. In some embodiments, the first micro light-emitting element 110X is located between the third semiconductor layer 121 and the bridge pattern 160. For example, the vertical projection range of the fourth semiconductor layer 122 exceeds the vertical projection range of the second semiconductor layer 112, and the vertical projection range of the bridge pattern 160 does not overlap the vertical projection range of the first micro light-emitting element 110X.

In addition, in this example embodiment, a protection layer 180 covering the first micro light-emitting element 110X may be further included. The protection layer 180 has a third opening H3 and a fourth opening H4. The third semiconductor layer 121 extends into the third opening H3 and is electrically connected to the first electrode 113, and at least part of the bridge pattern 160 is filled in or extends into the fourth opening H4 and is electrically connected to the second electrode 114, so that the repair micro light-emitting element 120 is disposed on the first micro light-emitting element 110X. It can be learned from another aspect that, in the vertical projection direction D3, a vertical projection range of the third opening H3 overlaps the vertical projection range of the third semiconductor layer 121, and therefore the third opening H3 can be viewed as substantially corresponding to the third semiconductor layer 121; a vertical projection range of the fourth opening H4 overlaps the vertical projection range of the bridge pattern 160, and therefore the fourth opening H4 can be viewed as substantially corresponding to the bridge pattern 160. The third semiconductor layer 121 in FIG. 7 is electrically connected to the first connecting line 130 on an edge of the first micro light-emitting element 110X, and the bridge pattern 160 is electrically connected to the second connecting line 140 on an edge of the first micro light-emitting element 110X. The third semiconductor layer 121 does not need to roughly completely overlap the first semiconductor layer 111, and the bridge pattern 160 does not need to roughly completely overlap the second opening H2 of the insulation layer 150, as shown in FIG. 6. Therefore, the process alignment tolerance of the repair micro light-emitting element 120 in FIG. 7 is greater than that of the repair micro light-emitting element 120 in FIG. 6.

Figure 8:
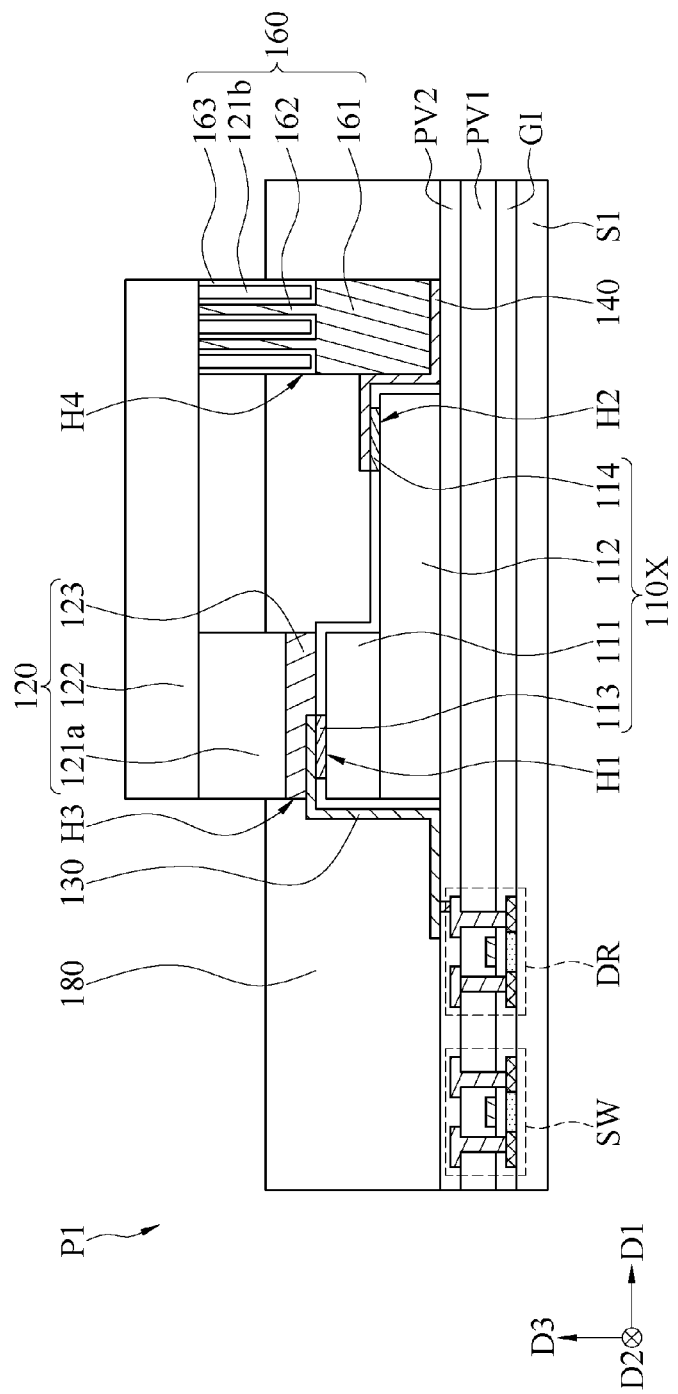
FIG. 8 is a schematic cross-sectional view of a sub-pixel according to still another example embodiment along section line B-B' corresponding to FIG. 4.
Figure 9:
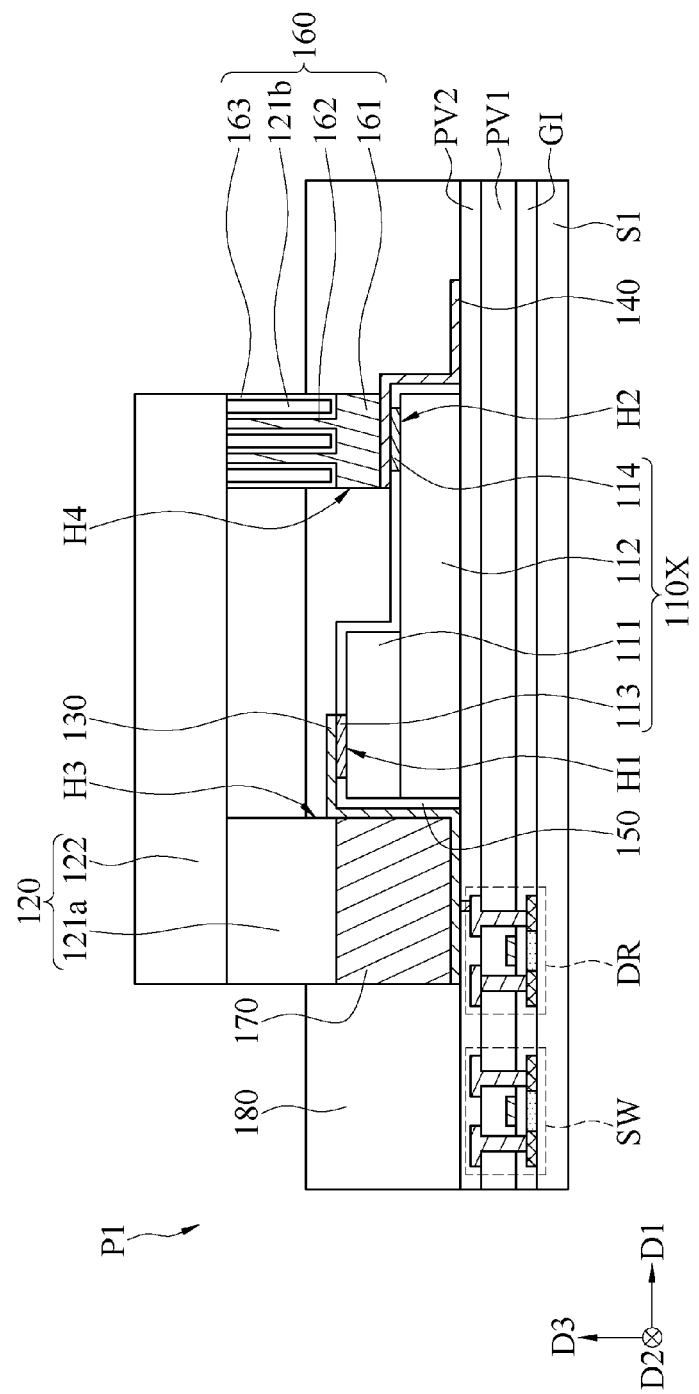
FIG. 9 is a schematic cross-sectional view of a sub-pixel according to still another example embodiment along section line B-B' corresponding to FIG. 4.
Figure 10:
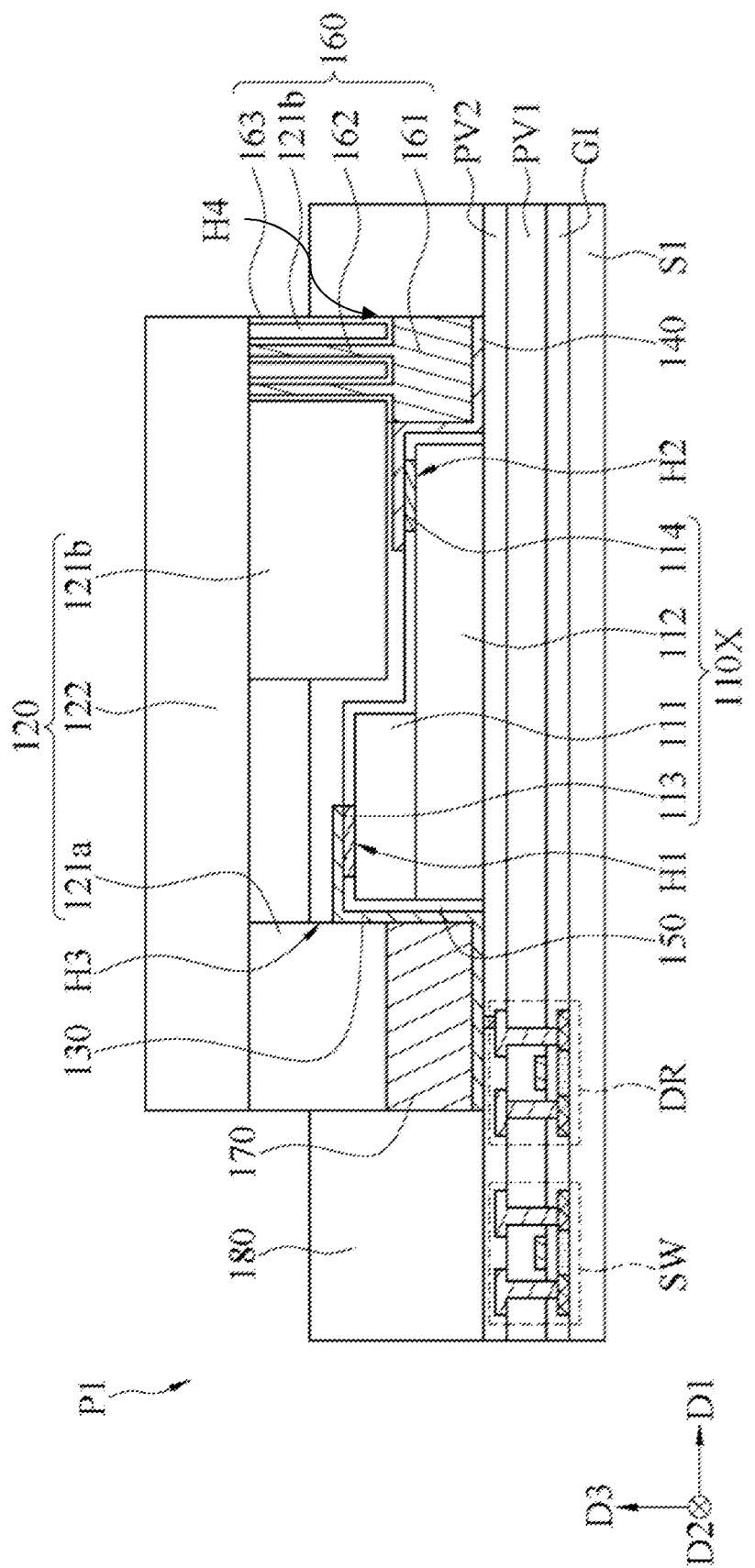
FIG. 10 is a schematic cross-sectional view of a sub-pixel according to yet another example embodiment along section line B-B' corresponding to FIG. 4.

Referring to FIG. 8, FIG. 8 is a schematic cross-sectional view of a sub-pixel according to still another example embodiment along section line B-B' corresponding to FIG. 4, and reference may be made to some embodiments of FIG. 6. In the still another example embodiment, the repair micro light-emitting element 120 has a shape similar to an inverted U shape or inverted U-like shape. The repair micro light-emitting element 120 further includes another third semiconductor layer 121*b*, and the another third semiconductor layer 121*b* may be used as part of the bridge pattern 160. In this example embodiment, the bridge pattern 160 includes a conductive electrode 161, the another third semiconductor layer 121*b*, and at least one conductive column (or namely conductive pillar) 162, as shown in FIG. 8, FIG. 9, and FIG. 10. The another third semiconductor layer 121*b* is located between the conductive electrode 161 and the fourth semiconductor layer 122, and the another third semiconductor layer 121*b* and a third semiconductor layer 121*a* have a substantially same doping type. It can be learned from another aspect that one end of the conductive column 162 is electrically connected to the second semiconductor layer 112, and the other end of the conductive column 162 is electrically connected to the fourth semiconductor layer 122. The conductive electrode 161 is located between the second connecting line 140 and the another third semiconductor layer 121*b*. The conductive column 162 passes through the another third semiconductor layer 121*b*, and one end of the conductive column 162 may be connected to the fourth semiconductor layer 122 through the other end of the conductive electrode 161, wherein the one end of the conductive electrode 161 is in contact with the second connecting line 140. The bridge pattern 160 may optionally further include an insulation pattern 163. The insulation pattern 163 is located on an outer surface of the conductive column 162, and electrically isolates the conductive column 162 from the another third semiconductor layer 121*b*. In this way, an unnecessary electrical connection between the conductive column 162 and the another third semiconductor layer 121*b* is avoided.

The thickness, shape, and disposing position of the conductive electrode 161 may be adjusted according to structures (an L-like shape or a U-like shape) of the first micro light-emitting element 110X and the repair micro light-emitting element 120 or a stacking design. In an implementation, as shown in FIG. 8, the conductive electrode 161 is disposed on the second connecting line 140 located on the substrate S1, and the thickness of the conductive electrode 161 is roughly a distance between a horizontal extending surface of a surface of the second connecting line 140 (such as the surface of the second connecting line 140 is not overlapped with the first semiconductor layer 111) and a horizontal extending surface of a surface of the first semiconductor layer 111 (such as the surface of the first semiconductor layer 111 is a upper surface of the first semiconductor layer 111). Therefore, the thickness of the conductive electrode 161 is roughly equivalent to the superposed thickness of the first semiconductor layer 111, the second semiconductor layer 121*a*, the first connecting line 130 (such as the thickness of the first connecting line 130 is overlapped with the second semiconductor layer 121a), and/or the third electrode 123, but the present disclosure is not limited thereto, as long as the fourth semiconductor layer 122 is roughly parallel to the substrate S1.

Referring to FIG. 9, FIG. 9 is a schematic cross-sectional view of a sub-pixel according to still another example embodiment along section line B-B' corresponding to FIG. 4. In addition, the pixel structure 100 may further include another bridge pattern 170 according to structures of the first micro light-emitting element 110X and the repair micro light-emitting element 120 or a stacking design. A difference between the embodiment of FIG. 9 and the embodiment of FIG. 8 lies in that the width of the fourth semiconductor layer 122 in the first direction D1 is greater than the width of the second semiconductor layer 112 in the first direction D1, and the embodiment of FIG. 9 may further include the another bridge pattern 170 disposed between the third semiconductor layer 121a and the first connecting line 130. In some embodiments, the third semiconductor layer 121a does not overlap the first opening H1 of the insulation layer 150 in the vertical projection direction D3 so as to raise the third semiconductor layer 121a. The height (for example, the thickness) of the conductive electrode 161 of the embodiment of FIG. 9 in the vertical projection direction D3 is less than that of the embodiment of FIG. 8. In addition, in this implementation, the another bridge pattern 170 may be integrally formed with the third electrode 123 shown in the embodiment of FIG. 6 according to a design.

In still another embodiment, the pixel structure 100 may further include a protection layer 180 covering the first micro light-emitting element 110X. The protection layer 180 has a third opening H3 and a fourth opening H4. The third semiconductor layer 121a extends into the third opening H3 and is electrically connected to the first electrode 113, and at least part of the bridge pattern 160 is filled in or extends into the fourth opening H4 and is electrically connected to the second electrode 114, so that the repair micro light-emitting element 120 is disposed on the first micro light-emitting element 110X. The third opening H3 corresponds to the third semiconductor layer 121a of the repair micro light-emitting element 120, and the fourth opening H4 corresponds to the bridge pattern 160. It can be learned from another aspect that in the vertical projection direction D3 (a normal direction parallel to the substrate S1 herein), a vertical projection range of the third opening H3 overlaps the vertical projection range of the third semiconductor layer 121a, and a vertical projection range of the fourth opening H4 overlaps a vertical projection range of the bridge pattern 160. In another implementation, the width of the fourth semiconductor layer 122 in the first direction D1 may be greater than the width of the second semiconductor layer 112 in the first direction D1. The position of the first electrode 113 is located on an outer side of the first micro light-emitting element 110X and near the first semiconductor layer 111. The position of the bridge pattern 160 roughly corresponds to the position of the second electrode 114. Herein, a projection of the third opening H3 does not overlap a projection of the first opening H1, and a projection of the fourth opening H4 partially overlaps a projection of the second opening H2.

Referring to FIG. 10, FIG. 10 is a schematic cross-sectional view of a sub-pixel according to yet another example embodiment along section line B-B' corresponding to FIG. 4. This example embodiment is a variant embodiment of FIG. 9. A difference lies in that compared with FIG. 9, the width of the another third semiconductor layer 121b in FIG. 10 in the first direction D1 is greater.

In another implementation, as shown in FIG. 7, FIG. 8, and FIG. 10, the width of the fourth semiconductor layer 122 in the first direction D1 may be greater than the width of the second semiconductor layer 112 in the first direction D1. The position of the first electrode 113 is located on an outer side of the first micro light-emitting element 110X and near the first semiconductor layer 111, and the position of the bridge pattern 160 opposite to the another bridge pattern 170 (for example, located on the other outer side of the first micro light-emitting element 110 relative to the third semiconductor layer 121a). While the FIG. 7 and FIG. 10 show that a projection of the third opening H3 does not overlap a projection of the first opening H1, the FIG. 8 shows that a projection of the third opening H3 overlaps a projection of the first opening H1. Further, while FIG. 8 shows that every 121b is placed within the bridge pattern 160 and the fourth opening H4 does not overlap a projection of the second opening H2.

Figure 11:
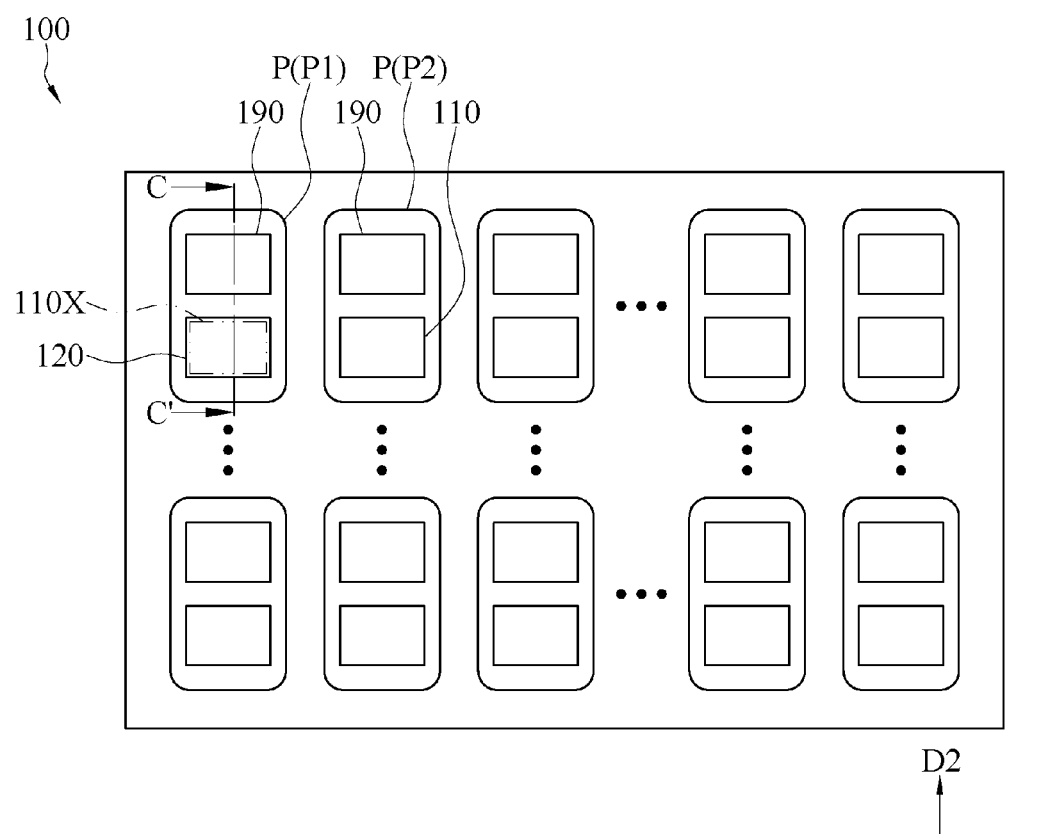
FIG. 11 is a top view of a pixel structure according to a second embodiment of the present disclosure.
Figure 12:
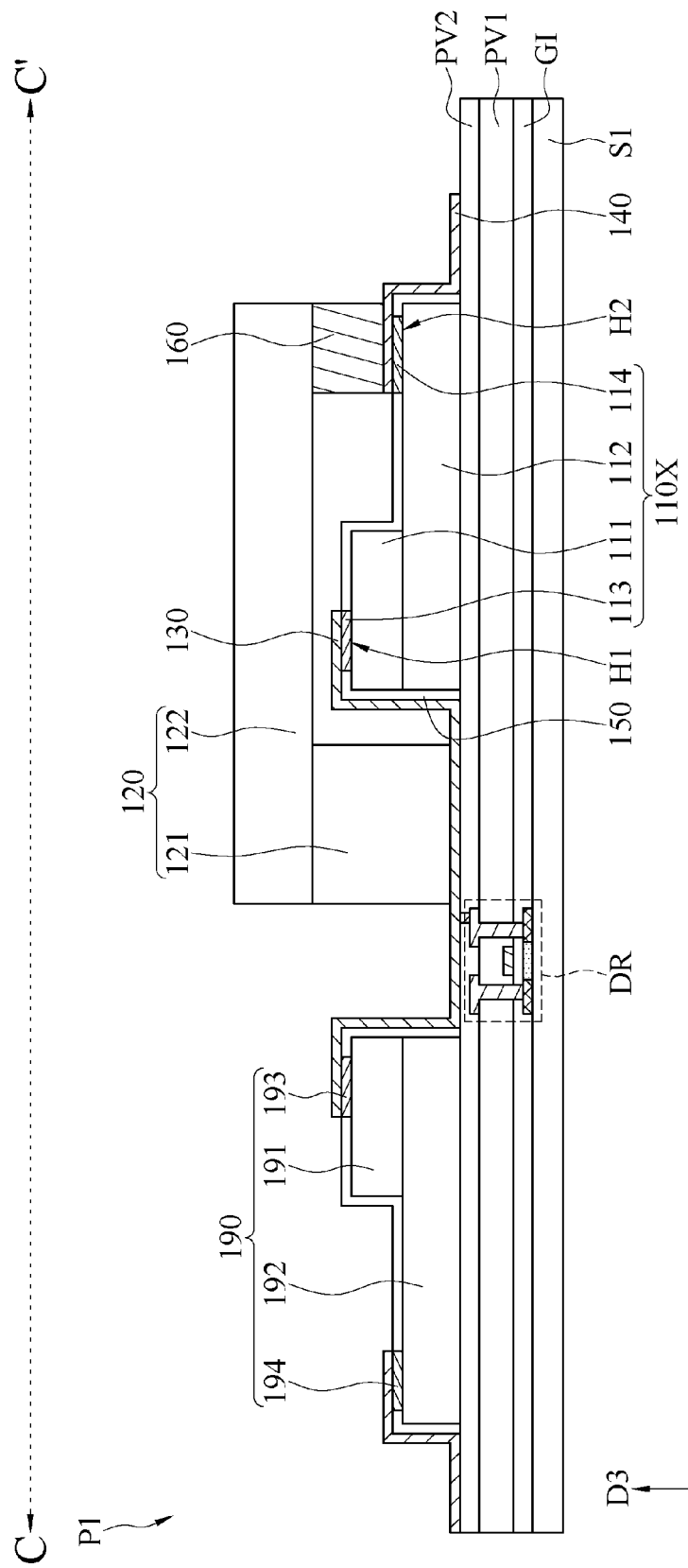
FIG. 12 is a schematic cross-sectional view of a pixel structure according to an example embodiment along section line C-C corresponding to FIG. 11.
Figure 13:
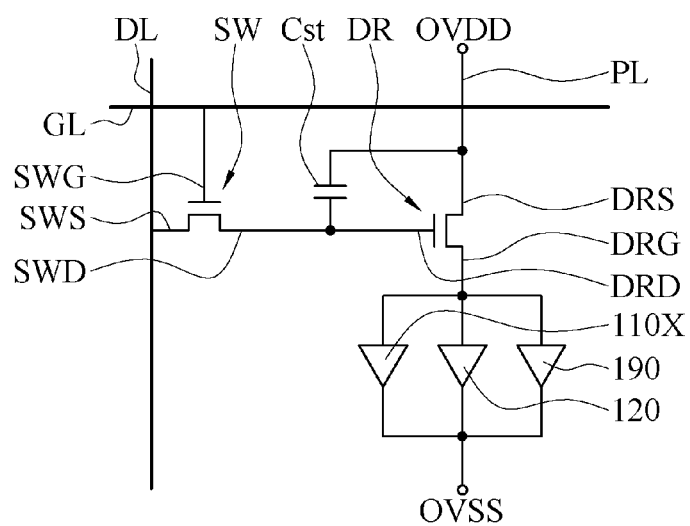
FIG. 13 is an equivalent circuit diagram of the pixel structure corresponding to FIG. 12.

In another embodiment, the pixel structure 100 includes multiple sub-pixels P, and at least one sub-pixel P may have two light-emitting elements (for example, a first micro light-emitting element 110X and a second micro light-emitting element 190). FIG. 11 is a top view of a pixel structure according to a second embodiment of the present disclosure. FIG. 12 is a schematic cross-sectional view of a pixel structure according to an example embodiment along section line C-C' corresponding to FIG. 11. FIG. 13 is an equivalent circuit diagram of the pixel structure corresponding to FIG. 12. Referring to FIG. 11, FIG. 12, and FIG. 13, it should be noted that, FIG. 12 is a simple schematic diagram, and does not show electrodes of the first micro light-emitting element 110X, the second micro light-emitting element 190, and a repair micro light-emitting element 120, or lines used for electrical connection are not shown (for example, first to fourth electrodes 113, 114, 123, 124, 193, 194, a first connecting line 130, a second connecting line 140, or other lines for subsequent description). For related descriptions of the first micro light-emitting element 110X and the repair micro light-emitting element 120, refer to and use one of the foregoing embodiments. Herein, if a detection result shows that a function of the first micro light-emitting element 110X and/or the second micro light-emitting element 190 is abnormal, a repair micro light-emitting element 120 is disposed on the first micro light-emitting element 110X and/or the second micro light-emitting element 190 for reprocessing or repair.

The second micro light-emitting element 190 includes another first semiconductor layer 191, another second semiconductor layer 192, another first electrode 193, and another second electrode 194. The another first semiconductor layer 191 is in contact with the another second semiconductor layer 192, the another first electrode 193 is electrically connected to the another first semiconductor layer 191, and the another second electrode 194 is electrically connected to the another second semiconductor layer 192. The another first electrode 193 of the second micro light-emitting element 190 is electrically connected to the first connecting line 130, and the another second electrode 194 is electrically connected to the second connecting line 140. In some implementations, the first micro light-emitting element 110X is preferably a horizontal diode structure. For example, the another first electrode 193 and the another second electrode 194 are separately located on a same side of the another first semiconductor layer 191 and the another second semiconductor layer 192, but the present disclosure is not limited thereto.

In an implementation, for a structure and/or material of the first another electrode 193 or the another second electrode 194, refer to the foregoing descriptions, for example, the structure and/or material of the first electrode 113 or the second electrode 114, and no further details are provided herein. However, in another implementation, a structure and/or material of the first another electrode 193 or the another second electrode 194 may optionally be substantially the same as or different from the structure and/or material of the first electrode 113 or the second electrode 114. For the descriptions, types, and/or materials of the another first semiconductor layer 191 and the another second semiconductor layer 192, refer to the first semiconductor layer 111 and the second semiconductor layer 112, and no further details are provided herein. However, in another implementation, the types and/or materials of the another first semiconductor layer 191 and the another second semiconductor layer 192 may optionally be substantially the same as or different from the types and/or materials of the first semiconductor layer 111 and the second semiconductor layer 112.

In this embodiment, a doping type of the another first semiconductor layer 191 is substantially the same as the doping type of the first semiconductor layer 111 and the third semiconductor layer 121, and a doping type of the another second semiconductor layer 192 is substantially the same as the doping type of the second semiconductor layer 112 and the fourth semiconductor layer 122. The another first semiconductor layer 191 of the second micro light-emitting element 190 is electrically connected to the first semiconductor layer 111 of the first micro light-emitting element 110X and the third semiconductor layer 121 of the repair micro light-emitting element 120 through the first electrode 113. The another second semiconductor layer 192 of the second micro light-emitting element 190 is electrically connected to the second semiconductor layer 112 of the first micro light-emitting element 110X and the fourth semiconductor layer 122 of the repair micro light-emitting element 120. Herein, the second micro light-emitting element 190, the first micro light-emitting element 110X, and the repair micro light-emitting element 120 are connected in parallel. In addition, The first micro light-emitting element 110X and the second micro light-emitting element 190 may optionally be disposed on the substrate S1 by using solder (not shown) or an adhesive layer (not shown).

In an implementation, as shown in FIG. 13, a driving architecture of the pixel structure 100 uses a 2T1C architecture as an example, but the present disclosure is not limited thereto. In other embodiments, one of the foregoing architectures may alternatively used. A drain electrode DRD of the driving element DR is electrically connected to the first micro light-emitting element 110X and the second micro light-emitting element 190. When a detection result shows that a function of the first micro light-emitting element 110X is abnormal, a repair micro light-emitting element 120 is disposed on the first micro light-emitting element 110X for reprocessing or repair.

For example, the first semiconductor layer 111, the another first semiconductor layer 191, and the third semiconductor layer 121 may be P-type semiconductor layers, the first electrode 113 and the another first electrode 193 may serve as anodes, the second semiconductor layer 112, the another second semiconductor layer 192, and the fourth semiconductor layer 122 may be N-type semiconductor layers, and the second electrode 114, the another second electrode 194, and the third electrode 123 or the bridge pattern 160 may serve as cathodes, but the present disclosure is not limited thereto. A power line PL provides a voltage OVDD which is transmitted to the first electrode 113, the another first electrode 193, and the repair micro light-emitting element 120 through the first connecting line 130. The second electrode 114, the another second electrode 194, and the third electrode 123 or the bridge pattern 160 may receive a voltage OVSS. The voltage OVSS may be a common voltage, a ground voltage, or another appropriate voltage.

In the pixel structure according to the embodiments of the present disclosure, when a function of the first micro light-emitting element is detected to be abnormal, the repair micro light-emitting element may be disposed vertically on the first micro light-emitting element. For example, the repair micro light-emitting element at least partially overlaps the first micro light-emitting element in a vertical direction of the substrate. In this case, the repair micro light-emitting element does not additionally occupy other space of a sub-pixel area, and a light field type of emitted light is not affected because the disposing position of the repair micro light-emitting element is away from that of the first micro light-emitting element. Therefore, compared with the comparative examples, the embodiments of the present disclosure do not need to remove the first micro light-emitting element or dispose insulation layers on the anode and the cathode of the first micro light-emitting element, thereby reducing steps of reprocessing or a repair process. In addition, the embodiments of the present disclosure improve the aperture ratio because of reprocessing or a repair process and don't affect the light field profile of the repair micro light-emitting element, so as to provide better optical quality. In addition, the repair micro light-emitting element may be electrically connected to the power line and/or the common voltage through the first connecting line and the second connecting line originally disposed for the first micro light-emitting element, so that a spare connecting pad and a spare circuit do not need to be additionally disposed after the first micro light-emitting element 110X is adhered to or electrically connected to the repair micro light-emitting element, thereby avoiding multiple process and a complex line design.

The technical content of the present disclosure is disclosed through exemplary embodiments; however, these embodiments are not intended to limit the present disclosure. Any changes and modifications made by a person skilled in the art without departing from the spirit of the present disclosure shall fall within the scope of the present disclosure. The protection scope of the present disclosure is subject to the appended claims.

What is claimed is:

1. A pixel structure, having at least one sub-pixel, wherein the at least one sub-pixel comprises:
  a substrate;
  a driving element, disposed on the substrate;
  a first micro light-emitting element, disposed on the substrate and electrically connected to the driving element, wherein the first micro light-emitting element comprises a first semiconductor layer with a first doping type, a second semiconductor layer with a second doping type, a first electrode, and a second electrode, the first doping type is different from the second doping type, the first electrode is electrically connected to the first semiconductor layer, and the second electrode is electrically connected to the second semiconductor layer;
- a repair micro light-emitting element, disposed on the first micro light-emitting element, wherein the repair micro light-emitting element comprises a third semiconductor layer with a third doping type and a fourth semiconductor layer with a fourth doping type, and the third doping type is different from the fourth doping type;
- a first connecting line, electrically connected to the first electrode, the third semiconductor layer, and the driving element;
- a second connecting line, electrically connected to the second electrode;
- an insulation layer, disposed on the first micro light-emitting element, wherein the insulation layer has a first opening partially overlapping the first connecting line in a vertical direction and a second opening partially overlapping the second connecting line in the vertical direction; and
- a first bridge pattern, located between the first micro light-emitting element and the repair micro light-emitting element, and electrically connected to the second electrode and the fourth semiconductor layer.

2. The pixel structure according to claim 1, wherein the repair micro light-emitting element further comprises a third electrode and a fourth electrode, the third electrode is located between the first connecting line and the third semiconductor layer, and the fourth electrode is located between the second connecting line and the fourth semiconductor layer.

3. The pixel structure according to claim 1, further comprising a second micro light-emitting element, wherein the second micro light-emitting element comprises another first semiconductor layer, another second semiconductor layer, another first electrode, and another second electrode, the another first electrode is electrically connected to the another first semiconductor layer, the another second electrode is electrically connected to the another second semiconductor layer, and the first connecting line is electrically connected to the another first electrode.

4. The pixel structure according to claim 1, wherein the third semiconductor layer extends toward the first micro light-emitting element.

5. The pixel structure according to claim 4, wherein the third semiconductor layer is overlapped in the vertical direction and located above the first semiconductor layer, and the second semiconductor layer overlaps the fourth semiconductor layer in the vertical direction.

6. The pixel structure according to claim 1, wherein the first semiconductor layer does not overlap the third semiconductor layer in the vertical direction, and the second semiconductor layer is smaller than the fourth semiconductor layer.

7. The pixel structure according to claim 1, wherein the fourth semiconductor layer is wider than the second semiconductor layer in a first direction.

8. The pixel structure according to claim 6, further comprising a second bridge pattern, disposed between the first connecting line and the third semiconductor layer.

9. The pixel structure according to claim 7, further comprising a second bridge pattern, disposed between the first connecting line and the third semiconductor layer.

10. The pixel structure according to claim 4, wherein the first bridge pattern comprises a conductive electrode with a first end and a second end, the first end is in contact with the fourth semiconductor layer, and the second end is in contact with the second connecting line.

11. The pixel structure according to claim 4, wherein the first bridge pattern further comprises a conductive electrode, a fifth semiconductor layer, and a conductive column with a first end and a second end; and
- wherein the conductive electrode is located between the second connecting line and the fifth semiconductor layer, the fifth semiconductor layer is located between the conductive electrode and the fourth semiconductor layer, the conductive column is passing through the fifth semiconductor layer, the first end of the conductive column is coupled to the conductive electrode, and the second end of the conductive column is coupled to the fourth semiconductor layer.

12. The pixel structure according to claim 11, wherein the first bridge pattern further comprises an insulation pattern for electrically isolating the conductive column from the fifth semiconductor layer.

13. The pixel structure according to claim 1, further comprising a protection layer covering the first micro light-emitting element and having a third opening and a fourth opening, wherein the third opening overlaps the third semiconductor layer in the vertical direction, and the fourth opening overlaps the first bridge pattern in the vertical direction.

14. The pixel structure according to claim 13, wherein the third opening overlaps the first opening in the vertical direction, and the fourth opening overlaps the second opening in the vertical direction.

15. The pixel structure according to claim 13, wherein the third opening does not overlap the first opening in the vertical direction, and the fourth opening does not overlap the second opening in the vertical direction.

16. The pixel structure according to claim 14, wherein the third semiconductor layer extends into the third opening to be electrically connected to the first electrode, and the first bridge pattern extends into the fourth opening to be electrically connected to the second electrode.

17. The pixel structure according to claim 15, wherein the third semiconductor layer extends into the third opening to be electrically connected to the first electrode, and the first bridge pattern extends into the fourth opening to be electrically connected to the second electrode.

18. The pixel structure according to claim 1, wherein the first micro light-emitting element is a to-be-repaired micro light-emitting element.

19. The pixel structure according to claim 1, wherein the first doping type and the third doping type are same, and the second doping type and the fourth doping type are same.

* * * * *